United States Patent [19]

Idelson

[11] 3,969,120

[45] July 13, 1976

[54] PHOTOGRAPHIC MULTICOLOR SCREEN ELEMENT AND METHOD FOR MAKING SAME

[75] Inventor: Elbert M. Idelson, Newton Lower Falls, Mass.

[73] Assignee: Polaroid Corporation, Cambridge, Mass.

[22] Filed: Oct. 3, 1974

[21] Appl. No.: 511,461

Related U.S. Application Data

[63] Continuation-in-part of Ser. No. 319,905, Dec. 29, 1972, abandoned.

[52] U.S. Cl. .................................... 96/118; 96/80

[51] Int. Cl.[2] ....................... G03F 5/00; G03C 1/84

[58] Field of Search .......... 96/118, 93, 115 R, 91 D, 96/80, 35.1, 36

[56] References Cited

UNITED STATES PATENTS

| | | | |
|---|---|---|---|
| 2,614,926 | 10/1952 | Land | 96/3 |
| 3,284,208 | 11/1968 | Land | 96/118 |

*Primary Examiner*—David Klein
*Assistant Examiner*—L. V. Falasco
*Attorney, Agent, or Firm*—Philip G. Kiely

[57] ABSTRACT

A blue-colored filter element of an additive color screen possessing enhanced light stability is prepared by applying to a hydrophilic colloid area an acid triphenyl methane dye and a phthalocyanine dye possessing at least two sulfonic acid groups.

9 Claims, 2 Drawing Figures

PHOTOGRAPHIC MULTICOLOR SCREEN ELEMENT AND METHOD FOR MAKING SAME

CROSS REFERENCE TO OTHER APPLICATION

This application is a continuation-in-part of U.S. application Ser. No. 319,905 filed Dec. 29, 1972, now abandoned.

BACKGROUND OF THE INVENTION

This invention relates to photography and, more particularly, to additive color screens and processes for preparing same.

In general, color screen elements comprise a screen pattern formed of a plurality of light-transmitting colored elements which are each of an independent primary color and which are generally classifiable into different groups in accordance with the color of said elements. Thus, a conventional three-color additive screen generally has a set or group of red-colored filter elements, a set of blue-colored filter elements, and a set of green-colored filter elements. These filter elements are ordinarily in a mosaic or geometrical pattern in a random or predetermined distribution.

Color screen elements may be prepared by a variety of mechanical or photomechanical methods. A particularly suitable method of preparing color screen elements is disclosed and claimed in U.S. Pat. No. 3,284,208, issued Nov. 8, 1966 to Edwin H. Land. The aforementioned patent is directed to a process which comprises successively coating the smooth surface of a lenticular film with a plurality of photosensitive layers and sequentially subjecting the coatings to selectively displaced radiation incident on and focused by the indicated lenticules. Subsequent to each exposure, unexposed coating is removed and the remaining exposed area dyed with the appropriate dyes to provide the desired series of chromatic filter elements. U.S. Pat. No. 3,284,208 is incorporated herein by reference in its entirety.

However, a number of problems are involved in the selection of the dyes for use in the above-mentioned processes. The primary consideration in the selection of the dye is, of course, the color produced thereby.

Stability to light is of prime importance to insure that the color will remain true substantially indefinitely since the color screen will be in position prior to use on the film and, of course, subsequent to exposure and processing of the film and subjected to light from projection lamps of high intensity for view. The compatibility and dyeability of the dye with respect to the dyeable substrate must also be considered as well as the fastness or retention of the dye in a given substrate since the migration of the dye from one area into an adjacent area dyed with a different color dye would result in the lack of sufficient color accuracy and intensity with respect to the area dyed, accuracy of boundaries between dyed areas, by such a redyeing or mixing of the colors of adjacent areas.

The dye must also possess the property of resistance to photographic processing compositions, for example, alkaline processing compositions such as those set forth in U.S. Pat. No. 2,614,926. While the susceptibility to degradation by contact with processing compositions can be minimized to some degree by the employment of barrier coats of suitable polymeric materials, for example, between each adjacent colored filter element or over all of the filter elements, such additional layers are not entirely desirable because of the possible loss of resolution in the resulting photographic image.

In summary, the dye system employed should readily dye the substrate but be firmly retained and anchored to the substrate to avoid migration and water fast to avoid dye migration under conditions of high humidity.

SUMMARY OF THE INVENTION

Hydrophilic colloids, such as gelatin, are dyed by applying an acid triphenyl methane dye and a phthalocyanine dye possessing at least two sulfonic acid groups in aqueous solution. A preferred acid triphenyl methane dye is;

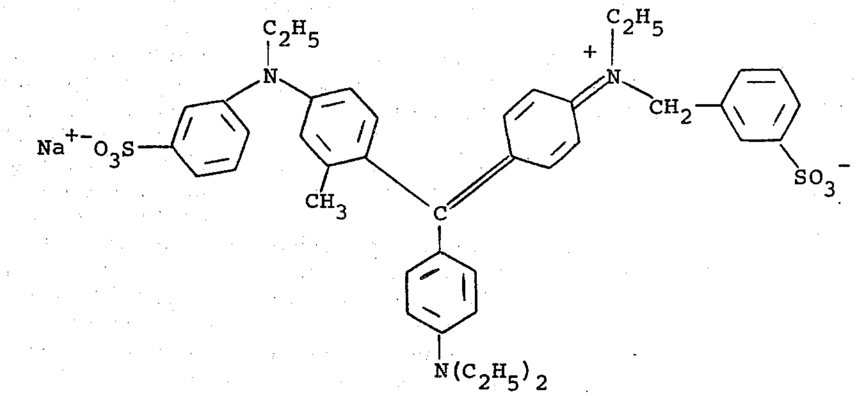

Acid Blue 104 (C.I. 42735)

The described system is particularly suitable for forming the blue-colored filter elements in an additive color screen.

DETAILED DESCRIPTION OF THE INVENTION

Figure 1:
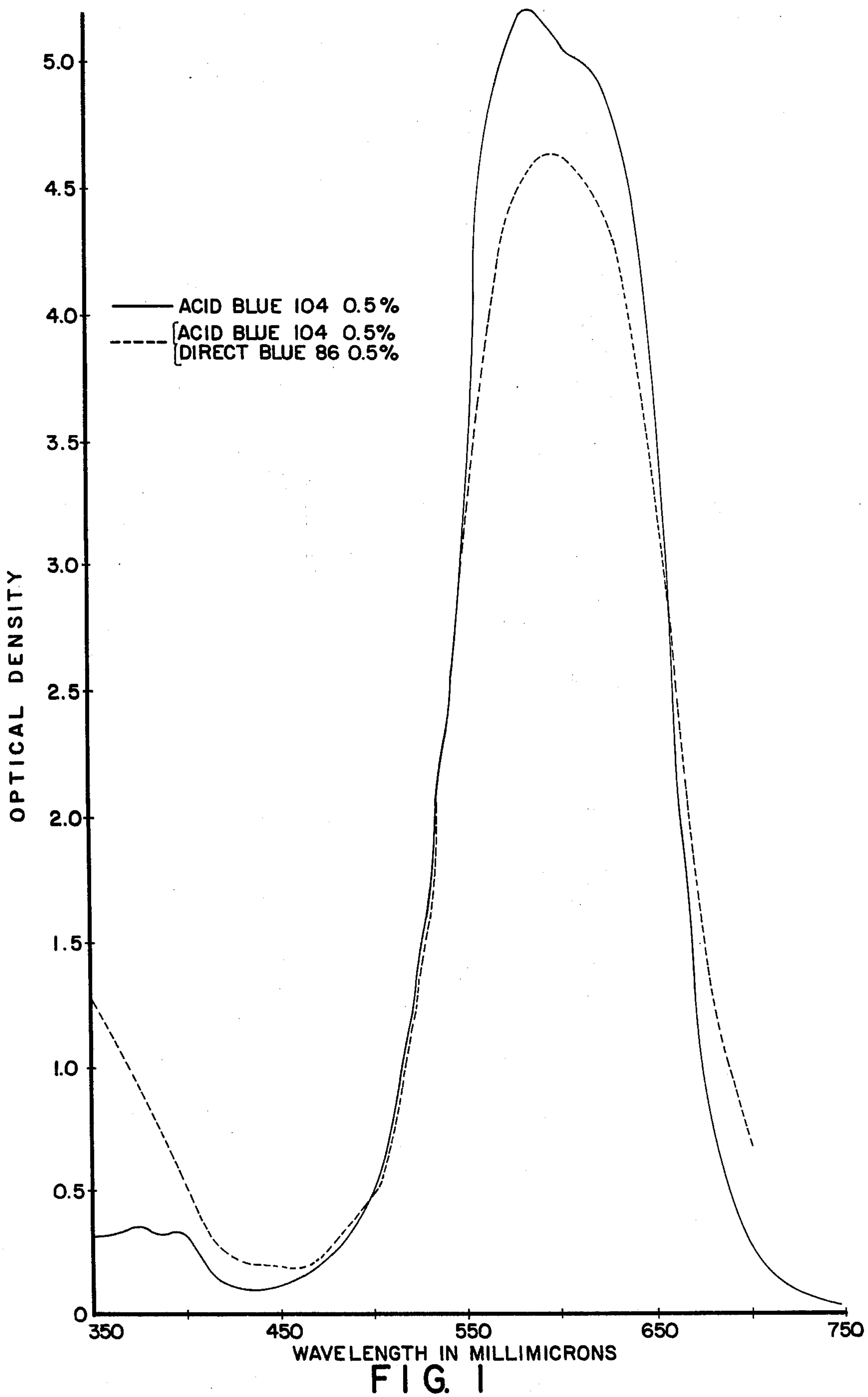
FIGS. 1 and 2 graphically record the change in optical density of the dye system of the present invention, as compared with a control, upon exposure to a Xenon arc fading test.

Blue chromatic filter screen elements are prepared by dyeing a hydrophilic colloid, arranged on a support in a predetermined geometric configuration, with an aqueous solution of an acid triphenyl methane dye, e.g., Acid Blue 104 or Acid Blue 24 and a phthalocyanine dye possessing at least two sulfonic acid groups. Preferably, the dye solution includes buffers, e.g., sodium acetate/acetic acid, to provide a pH of about 4–6. The dyed substrate is then contacted with fixing bath such as an aqueous solution of the dimer of cyanamide cross-linked with formaldehyde to precipitate and fix the dye.

In a particularly preferred embodiment, the dye bath includes both the acid triphenyl methane and the phthalocyanine dye. However, the dyes may also be applied to the colloid from separate dye baths.

A preferred phthalocyanine dye suitable for use in the present invention is:

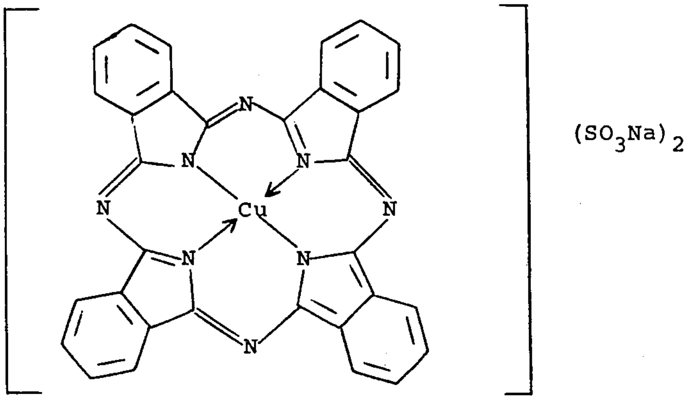

Direct Blue 86 (C.I. 74180)

Other suitable phthalocyanine dyes are those which possess the same structure as shown above except that one or two additional sulfonic acid substituents are present.

Unexpectedly, it has been found that employment of the described combination provides enhanced light stability. In addition greater optical density to the dyed colloid beyond the 650 $\mu$ range is provided.

As stated above, the novel method of the present invention is particularly suitable for the preparation of additive multicolor screen elements.

The method of the present invention is particularly suited for use in the method disclosed in the above-mentioned U.S. Pat. No. 3,284,208 which is incorporated by reference herein in its entirety.

Photosensitized gelatin, i.e., potassium, sodium or ammonium dichromate sensitized gelatin, which has been hardened by photoexposure, is the preferred dyeable material employed in the manufacture of the additive color screens of the present invention. Other suitable materials include photosensitized and exposed albumin, casein, gum arabic, polyvinyl alcohol, and other light-sensitive polymeric materials known to the art.

The novel dye system of the present invention is preferably contacted with the dichromated hydrophilic colloid in suitable solvent solutions, preferably aqueous solutions. The particular intensity of the dyed area may be selected by the employment of the dye concentration in the solutions and the selection of each dye. Preferably, the concentration of each dye solution is 0.1 to 5% by weight, preferably 1%. Dyeing is preferably carried out at elevated temperatures, e.g., 60° to 150°F. In addition to the dye, the dye solutions may contain suitable wetting agents and/or dispersing agents, thickeners, buffers, acetic acid, and the like. Subsequent to the dye application, the colloid may be contacted with cold water or other suitable solvent to remove any residual or excess dye which has not co-reacted. Preferably, the colloid layer is dried, as by the application of elevated temperatures prior to subsequent dyeing steps.

As described above, the dyeing of the colloid material with the dye system of the present invention provides a barrier to other dyes to substantially prevent redyeing of the layer. It has been found that physical handling and transport of a dyed layer may result in physical damage to the layer resulting in a phenomenon described as "scratch redyeing". This phenomenon results from a physical disturbance to the surface of the dyed area which apparently renders the dyed material susceptible to redyeing by the subsequent dyeing operation employed in the preparation of a second colored element. The redyeing effect resulting from physical damage to the dyed area, however, can be substantially obviated by adding an aftertreatment to the dyed gelatin, such as the application of chrome salts such as chrome alum, the sulfate, chloride and the like, or zirconium sulfate. Preferably, chrome alum or a combination of 4% chrome alum with 7% zirconium sulfate at a pH of 2.0 is employed.

The present invention will be further illustrated and detailed in conjunction with the following illustrative procedures which set out representative embodiments and photographic utilization of the novel photographic film units of this invention, which, however, are not limited to the details therein set forth and are intended to be illustrative only.

A lenticular film may be first coated with an adhesive composition containing 70 cc. of methanol, 1.25 grams of nitrocellulose, and 30 cc. of butyl alcohol. A first layer of gelatin, sensitized by the addition of 15 weight percent potassium dichromate (based on dry gelatin), may be then coated on the external surface of the first adhesive layer. The first gelatin layer may be then exposed to ultraviolet radiation, in accordance with the previously detailed explanation set forth in U.S. Pat. No. 3,284,208, and the resultant photoexposed carrier subjected to the described water wash steps to provide removal of unexposed sensitized gelatin, in accordance with the exposure pattern contained in the first gelatin layer. The web may be then treated with an aqueous bath comprising 6% of chromecomplexed phenylazo pyrazolone and naphthylazo pyrazolone dye as described in application Ser. No. 185,403 filed Sept. 30, 1971, now U.S. Pat. No. 3,730,725.

The web may then be rinsed, dried and a second adhesive composition containing 70 cc. of methanol, 30 cc. of butyl alcohol, and 1.25 grams of nitrocellulose overcoated thereon. A second layer of gelatin, sensitized by the addition of 15 weight percent potassium dichromate, may then be coated on the second adhesive layer. The second photosensitized gelatin layer may be exposed to ultraviolet radiation in accordance with the previously detailed description. The second gelatin layer may then be washed with water to effect removal of unexposed photosensitive gelatin, in the manner previously detailed. The web is then treated with an aqueous bath comprising 1.0% by weight of Acid Blue 104, 0.5% of Direct Blue 86, 1.6% sodium acetate and 1.0% acetic acid. The thus-dyed layer may then be passed through an aqueous bath containing 1.0% by weight of the dimer of cyanamide cross-linked with formaldehyde (pH = 4.0) (Commercially available as Sandofix, Sandoz Colors and Chemicals, Hanover, New Jersey). The web may be then rinsed to effect removal of any residual excess dye, dried and coated with a third adhesive composition comprising 30 cc. butanol, 1.25 grams of nitrocellulose, and 70 cc. of methanol. A third layer of gelatin, sensitized with 15 weight percent potassium dichromate may be then coated on the external surface of the third adhesive layer. The third photosensitive gelatin layer was subjected to exposure by ultraviolet radiation, in accordance with the description detailed previously. The third layer of photosensitive gelatin was then washed in order to provide the desired resist formation. Alternatively, if only a trichromatic element is desired, the lenticular layer may be removed by methods described above and the photosensitive layer exposed without the lenticular layer, with the previously formed elements masking those portions of the photosensitive layer adjacent thereto. The resultant resist may be dyed by contact with solutions containing Direct Green 75 and a Basic Yellow. A protective overcoat layer may be provided by coating the external surface of the multicolor screen element with a composition comprising 70 cc. of methanol, 30 cc. of butanol, and 5 grams of nitrocellulose. A diffusion transfer image-receiving layer comprising a silver-receptive stratum containing silver precipitating nuclei dispersed in a matrix of deacetylated chitin may be then coated on the external surface of the protective layer, according to the practice described in U.S. Pat. No. 3,087,815 issued Apr. 20, 1963, to W. H. Ryan et al. The image-receiving layer was then overcoated with a panchromatic silver iodobromide gelatin emulsion.

It should be understood that while the present invention was illustrated with reference to the blue elements, all the filter elements may be prepared by the novel system of the present invention.

The thus-formed additive multicolor diffusion transfer film unit may then be exposed to a predetermined subject and the latent image contained in the emulsion diffusion transfer processed, by contact thereof with a diffusion transfer processing composition, in accordance with the practice previously described. After an imbibition period of approximately 15 seconds the emulsion, together with the processing composition, may be stripped from contact with the image-receiving layer to uncover a positive transfer print formed in the image-receiving layer. Alternatively, in accordance with the teaching set forth in U.S. Pat. Nos. 3,536,488; 3,615,427; 3,615,428; 3,615,429; and 3,615,426 the film unit may be maintained as a permanent laminate.

Projection of the resultant additive multicolor print showed satisfactory contrast, density and range.

In order to demonstrate the enhanced light stability of the dyed colloid of the present invention, samples of gelatin were dyed with dye baths containing 0.5% Acid Blue 104 and varying amounts of Direct Blue 86 The dyed samples were then subjected to a Xenon arc fading test. The results of the test are set forth in Table 1 below.

Table 1

| Concentration of Direct Blue 86 | % Optical Density Remaining at 535 mu 24 hrs. | 48 hrs. | 96 hrs. | 144 hrs. |
|---|---|---|---|---|
| 0.00 (Control) | 74 | 47 | 25 | 15 |
| 0.10 | 77 | 51 | 29 | 17 |
| 0.25 | 72 | 48 | 26 | 16 |
| 0.05 | 83 | 57 | 33 | 23 |
| 0.10 | 86 | 72 | 46 | 31 |
| 0.25 | 96 | 82 | 60 | 46 |
| 0.50 | 99 | 89 | 77 | 64 |

From the table above, it will be noted that the combination of the dyes provides significantly enhanced resistance to fading.

To more closely approximate actual photographic employment of the dye system, dyed gelatin samples were prepared and subjected to exposure in a Kodak Carousel Slide Projector. Since Direct Blue 86 has little absorption in the green, the optical densities in the green column were measured on a Macbeth Densitometer.

Table 2

| Hours Exposure | Acid Blue 104 0.5% | Acid Blue 104-0.5% Direct Blue 86-0.5% | Acid Blue 104-0.5% Direct Blue 86-1.0% |
|---|---|---|---|
| 0 | 2.01 | 2.01 | 2.19 |
| 1 | 1.83 | 1.94 | 2.18 |
| 2 | 1.55 | 1.77 | 2.10 |
| 3 | 1.37 | 1.69 | 2.08 |
| 4 | 1.13 | 1.60 | 2.06 |

The above table shows serious fading (38%) of the Acid Blue 104 alone after 4 hours while the addition of Direct Blue 86 at 0.5% shows only 12% fading and at 1.0% only about 5% fading.

Figure 2:
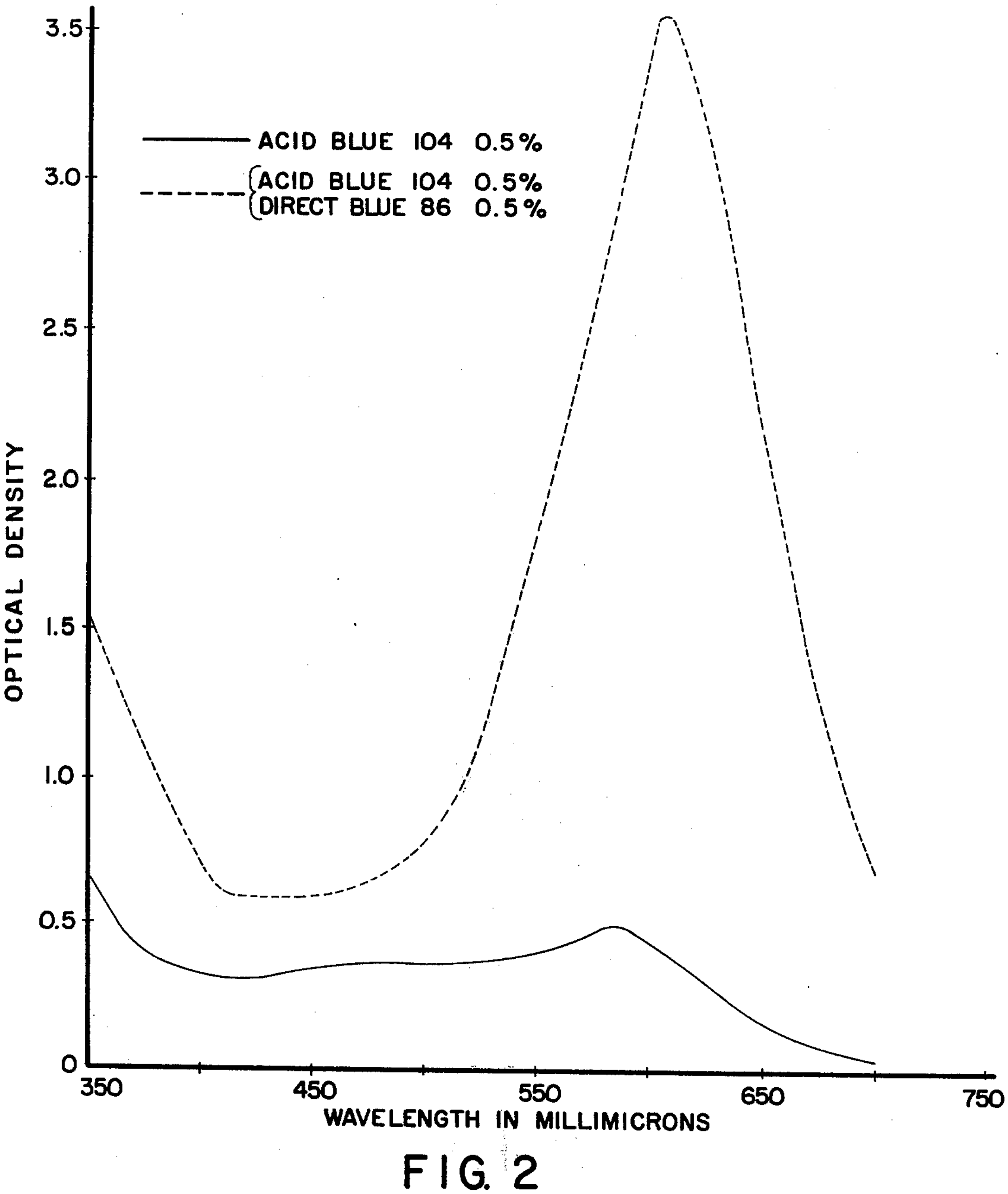

The higher stability of the dye systems of the present invention is illustrated graphically in the figures where the change in optical density of a single dye and a dye system of the present invention over a range of 350–750 millimicrons is recorded before exposure (FIG. 1) and after exposure to a Xenon arc for 144 hours (FIG. 2).

It is desirable, of course, that the adhesion of the carrier, the three monochromatic filter layers, etc., should be very secure so that the individual structures will remain bonded during the manufacture and processing of the finished product, and further that there will be subsequently no mechanical separation of the various layers which will create optical and mechanical difficulties.

Under these circumstances, it may be desirable to interpose adhesive or lacquer layers between the respective layers and filter elements. The adhesive layer selected should be one which does not deleteriously interfere with the transparency of the final product, and yet provides sufficient adhesive capacity so as to allow vigorous treatment of the film unit during and subsequent to its production. The aforementioned nitrocellulose has been found to be a highly desirable bonding agent, although other adhesives known in the art for the instant purposes may be employed, where desired.

Although for photographic purposes the panchromatic emulsion layer could be applied to the rear side of the carrier, for practical purposes it is necessary to coat the emulsion on the color screen side of the carrier to provide the high color saturation.

After exposure of this film, a latent image is formed in the emulsion layer and this may be processed in the same manner as black and white images are processed, without regard to the filter screen which is spaced between the carrier and the panchromatic emulsion, particularly where the filter screen is protected by a protective polymeric composition.

If a positive transparency film is desired, the image may be reversed in the conventional manner or the positive transparency film may be provided by the aforementioned diffusion transfer photographic processes.

In the description herein, each color series of filter elements has been described as covering that part of the total area in proportion to the total number of colors used, i.e., in the tri-color system, each color occupies one-third of the total area. This may vary quite widely before having a noticeable effect to the observer and, in fact, may be compensated by changing the intensity of the colors. In actual practice, if one dye is of greater intensity than the others, a deliberate compensation may be made by reducing the total relative area of the intense color. The aspect of relative areas is well known in the art so that when relative areas are used in this application, it is intended to include the variances which the art would recognize as being successful.

Lenticular films employed have comprised 320, 550, 750 and 1000 lenticules per inch and may be prepared by any of the conventional procedures well known for production of such films. The focal length of the light modulating lenticules employed is generally in the order of about 100 *u* in air and, as a result of this short focal length, any object over about one inch from the lens surface is at infinity. As a consequence of this, maintenance of the exposure source in focus is simplified.

Specifically, a suitable polymeric film base web may be continuously contacted with a rotating embossing roller under appropriate conditions of temperature, pressure and/or solvents to provide lenticules of the shape and size desired.

Since certain changes may be made in the above processes and products without departing from the scope of the invention herein involved, it is intended that all matter contained in the above description or shown in the accompanying drawings shall be interpreted as illustrative and not in a limiting sense.

What is claimed is:

1. A photographic multicolor screen element which comprises, in combination, a geometrically repetitive plurality of chromatic filter element series; at least one of said chromatic filter element series comprising filter elements comprising a hydrophilic colloid dyed with an acid triphenyl methane dye and a phthalocyanine dye containing at least two sulfonic acid groups.

2. A product as defined in claim 1 wherein said acid triphenyl methane dye is Acid Blue 104.

3. A product as defined in claim 1 wherein said chromatic filter elements are in substantially side-by-side relationship.

4. The product as defined in claim 1 wherein said hydrophilic colloid comprises dichromated gelatin which has been exposed to light and washed with water.

5. The product as defined in claim 1 wherein said phthalocyanine dye is Direct Blue 86.

6. A product as defined in claim 1 wherein said filter elements are carried on a transparent support.

7. A product as defined in claim 6 including a panchromatic photographic emulsion layer on the surface of said chromatic filter elements opposite said support.

8. A product as defined in claim 7 including a photographic diffusion transfer image-receiving layer intermediate said emulsion layer and said chromatic filter elements opposite said support.

9. A photographic trichromatic additive color screen element which comprises a flexible, transparent polymeric support carrying on one surface a geometrically repetitive plurality of monochromatic filter elements comprising red, green and blue filter elements wherein said blue filter elements include Acid Blue 104 and Direct Blue 86.

* * * * *